United States Patent
Weng et al.

(10) Patent No.: US 9,136,442 B2
(45) Date of Patent: Sep. 15, 2015

(54) MULTI-VERTICAL LED PACKAGING STRUCTURE

(71) Applicant: TSMC Solid State Lighting Ltd., HsinChu (TW)

(72) Inventors: Jui-Ping Weng, Houlong Township, Miaoli County (TW); Hsiao-Wen Lee, Hsinchu (TW); Chun-Chih Chang, Taichung (TW); Min-Sheng Wu, Guanyin Township, Taoyuan County (TW); Hsin-Hsien Lee, Longtan Township, Taoyuan County (TW)

(73) Assignee: TSMC SOLID STATE LIGHTING LTD., Hsinchu (TW)

( * ) Notice: Subject to any disclaimer, the term of this patent is extended or adjusted under 35 U.S.C. 154(b) by 32 days.

(21) Appl. No.: 13/750,097

(22) Filed: Jan. 25, 2013

(65) Prior Publication Data
US 2014/0209930 A1 Jul. 31, 2014

(51) Int. Cl.
*H01L 27/15* (2006.01)
*H01L 33/62* (2010.01)
*H01L 33/50* (2010.01)
*H01L 25/075* (2006.01)

(52) U.S. Cl.
CPC ............ *H01L 33/50* (2013.01); *H01L 25/0753* (2013.01); *H01L 27/15* (2013.01); *H01L 27/153* (2013.01); *H01L 33/62* (2013.01); *H01L 2924/0002* (2013.01)

(58) Field of Classification Search
None
See application file for complete search history.

(56) References Cited

U.S. PATENT DOCUMENTS

| | | |
|---|---|---|
| 8,076,680 B2 * | 12/2011 | Lee et al. .................... 257/88 |
| 2004/0222433 A1 * | 11/2004 | Mazzochette et al. ...... 257/99 |
| 2009/0261357 A1 * | 10/2009 | Daniels ........................ 257/88 |
| 2011/0193105 A1 * | 8/2011 | Lerman et al. .............. 257/88 |

* cited by examiner

*Primary Examiner* — Johannes P Mondt
(74) *Attorney, Agent, or Firm* — Muncy, Geissler, Olds & Lowe, P.C.

(57) ABSTRACT

The present disclosure involves a light-emitting diode (LED) packaging structure. The LED packaging structure includes a submount having a substrate and a plurality of bond pads on the substrate. The LED packaging structure includes a plurality of p-type LEDs bonded to the substrate through a first subset of the bond pads. The LED packaging structure includes a plurality of n-type LEDs bonded to the substrate through a second subset of the bond pads. Some of the bond pads belong to both the first subset and the second subset of the bond pads. The p-type LEDs and the n-type LEDs are arranged as alternating pairs. The LED packaging structure includes a plurality of transparent and conductive components each disposed over and electrically interconnecting one of the pairs of the p-type and n-type LEDs. The LED packaging structure includes one or more lenses disposed over the n-type LEDs and the p-type LEDs.

18 Claims, 17 Drawing Sheets

MULTI-VERTICAL LED PACKAGING STRUCTURE

TECHNICAL FIELD

The present disclosure relates generally to light-emitting devices, and more particularly, to a low cost light-emitting diode (LED) structure with better light output.

BACKGROUND

LEDs are semiconductor photonic devices that emit light when a voltage is applied. LEDs have increasingly gained popularity due to favorable characteristics such as small device size, long lifetime, efficient energy consumption, and good durability and reliability. In recent years, LEDs have been deployed in various applications, including indicators, light sensors, traffic lights, broadband data transmission, back light unit for LCD displays, and other suitable illumination apparatuses. For example, LEDs are often used in illumination apparatuses provided to replace conventional incandescent light bulbs, such as those used in a typical lamp.

However, existing LEDs still have drawbacks. For example, conventional LED packaging structures typically employ wire bonding to establish electrical connections for a plurality of LEDs. This type of packaging structure makes it difficult to provide a high density lumens light output and may be expensive as well.

Therefore, although existing LEDs have been generally adequate for their intended purposes, they have not been entirely satisfactory in every aspect. LED packaging structures that offer better light output and lower cost continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
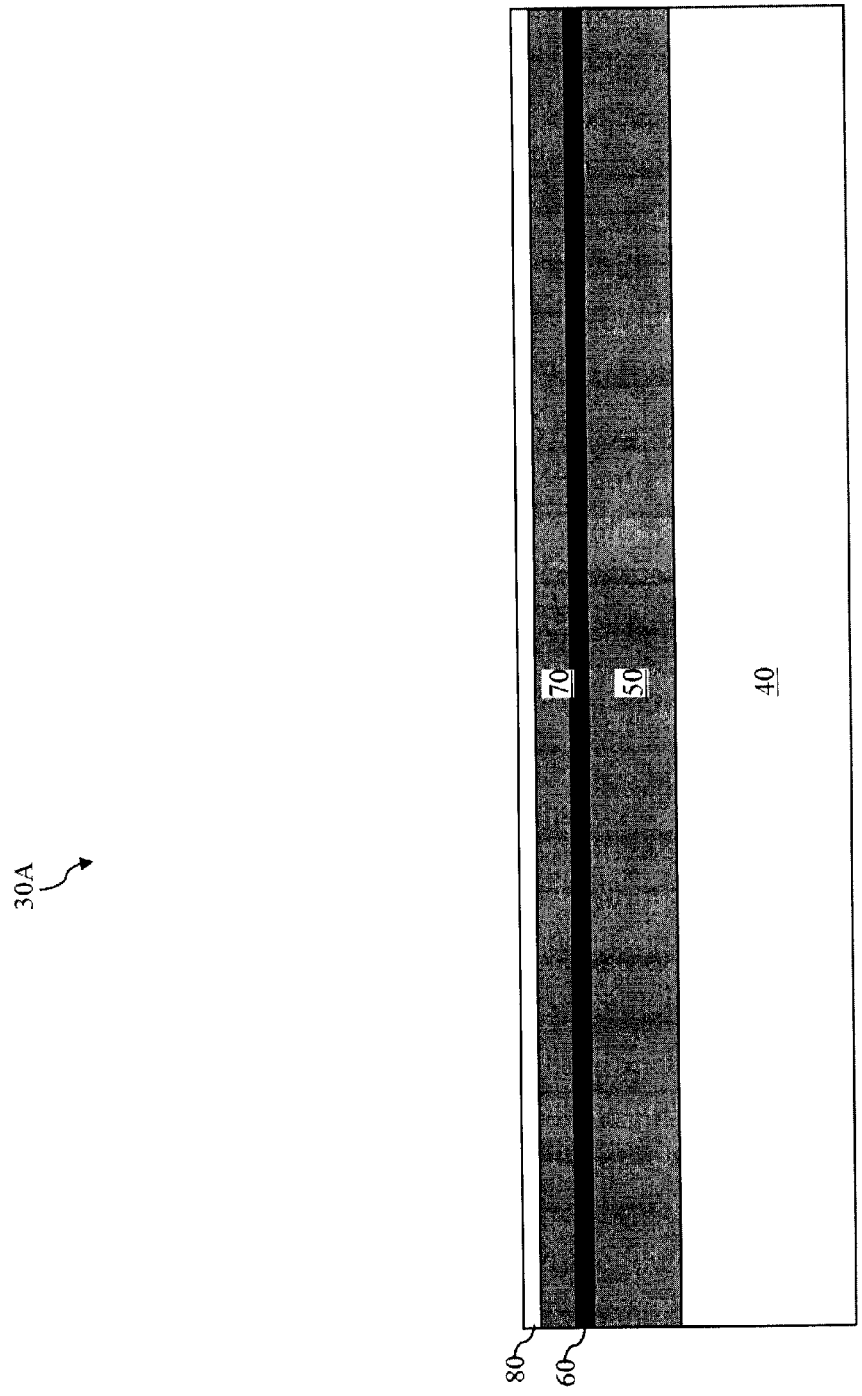
FIGS. 1-14 are diagrammatic fragmentary cross cross-sectional side views of an LED structure at different stages of fabrication and packaging according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Semiconductor devices can be used to make photonic devices, such as light-emitting diodes (LEDs). When turned on, LEDs may emit radiation such as different colors of light in a visible spectrum, as well as radiation with ultraviolet or infrared wavelengths. Compared to traditional light sources (e.g., incandescent light bulbs), lighting instruments using LEDs as light sources offer advantages such as smaller size, lower energy consumption, longer lifetime, variety of available colors, and greater durability and reliability. These advantages, as well as advancements in LED fabrication technologies that have made LEDs cheaper and more robust, have added to the growing popularity of LED-based lighting instruments in recent years.

However, existing LEDs still have drawbacks. For example, traditional LED packaging structures usually involve horizontal LEDs and may employ wire bonding to establish electrical connections for these horizontal LEDs. Due to the bond wires, the light output of the LEDs may be adversely affected. Furthermore, traditional LED packaging structures using the wire bonding scheme tend to consume more chip area, thereby driving up the cost of fabrication.

According to embodiments of the present disclosure, an improved LED packaging structure is disclosed that offers better electrical connections between the LEDs, higher light output, and lower costs. The processes used to fabricate such LED packaging structure according to some embodiments are discussed below with reference to FIGS. 1-17, which have been simplified for the present disclosure.

Figure 2:
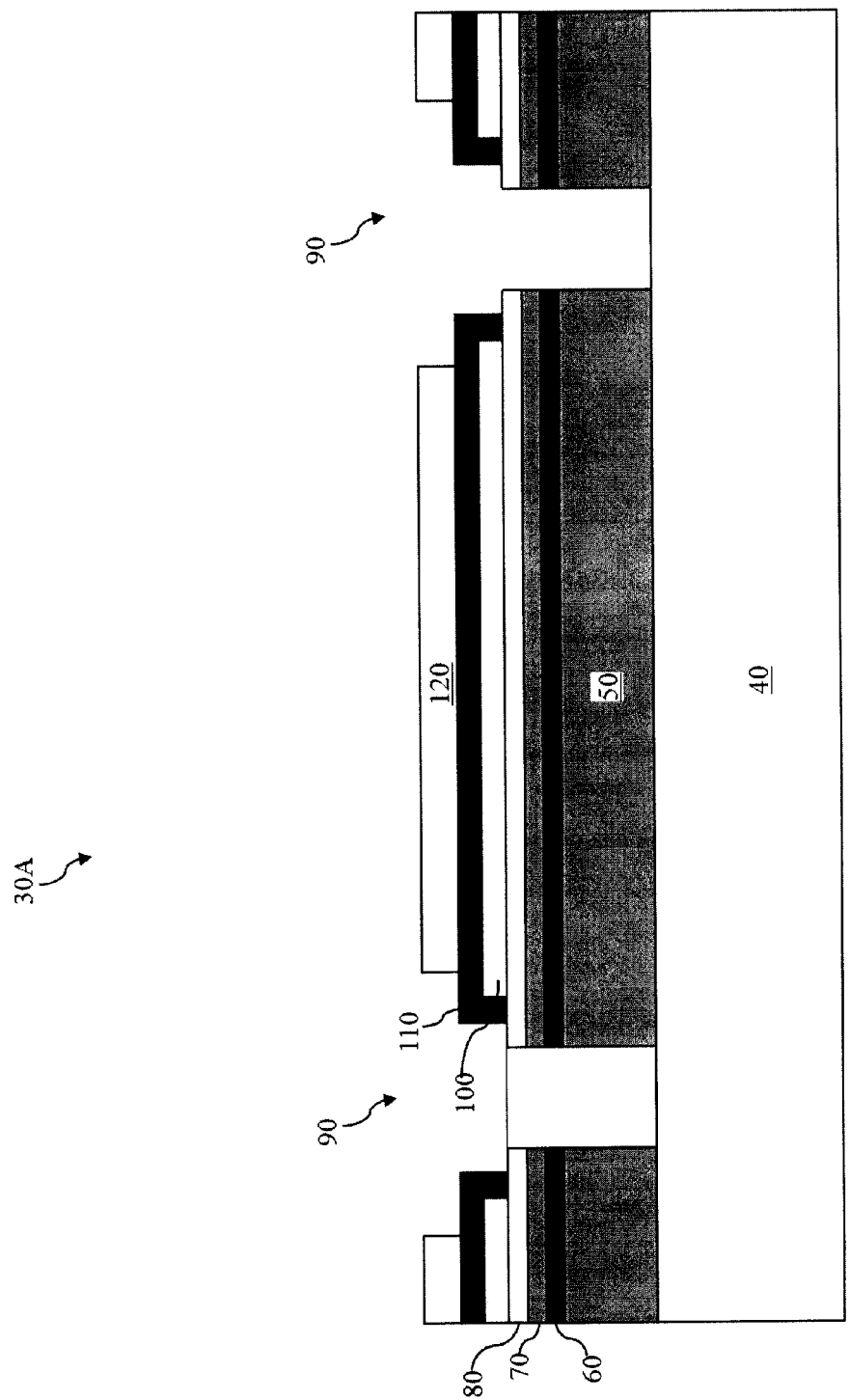
Figure 3:
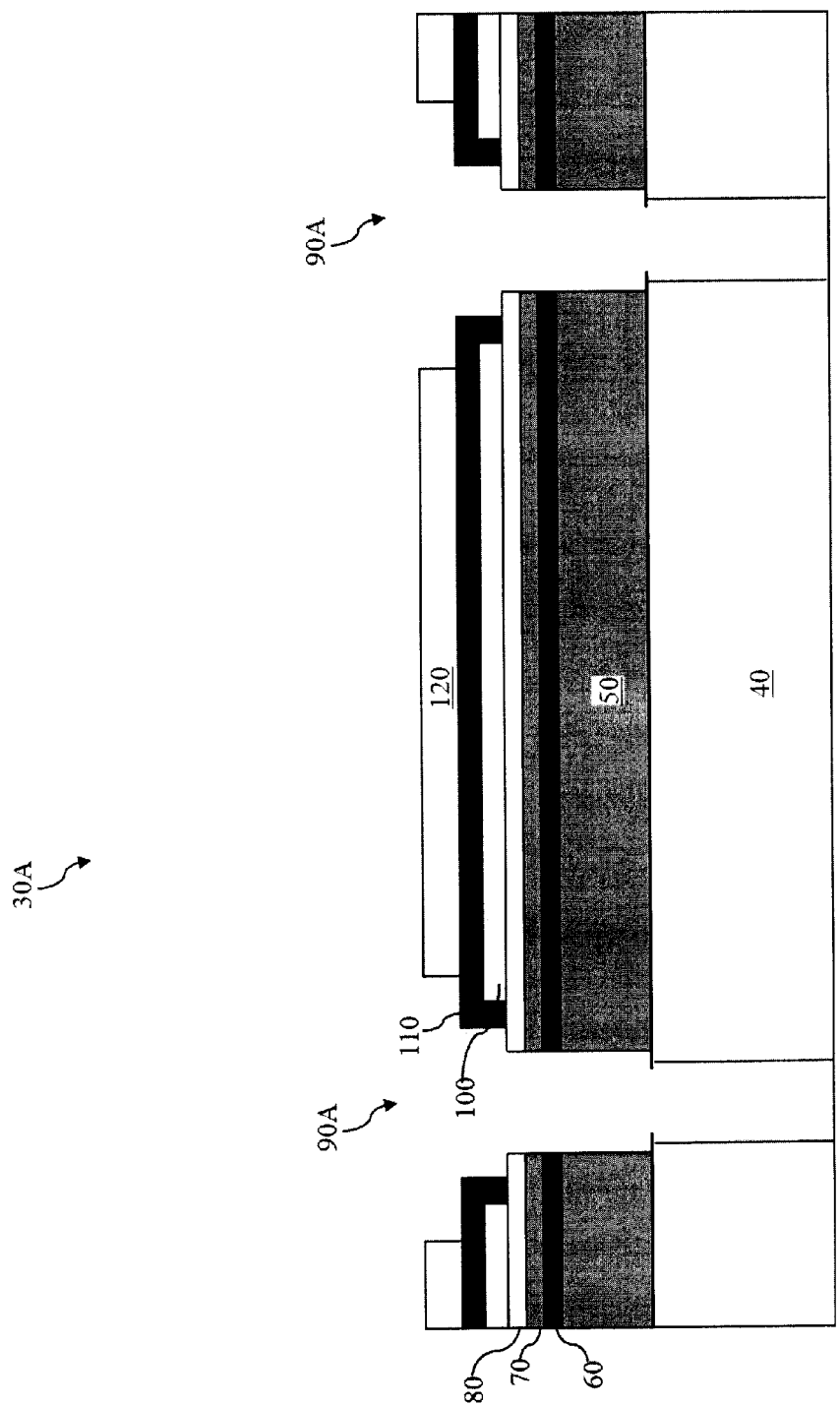

FIGS. 1-3 are diagrammatic cross-sectional views illustrating the formation of a p-type vertical LED 30A. Referring now to FIG. 1, the LED 30A includes a substrate 40. In some embodiments, the substrate 40 includes a sapphire material suitable for epitaxially growing a III-V compound material thereon. A III-V compound contains an element from a "III" group (or family) of the periodic table, and another element from a "V" group (or family) of the periodic table. For example, the III group elements may include Boron, Aluminum, Gallium, Indium, and Titanium, and the V group elements may include Nitrogen, Phosphorous, Arsenic, Antimony, and Bismuth. In other embodiments, the substrate 40 may contain silicon, silicon carbide, gallium arsenide, or gallium nitride. In some embodiments, the substrate 40 may have a thickness that is in a range from about 50 um to about 1000 um.

In certain embodiments, an undoped semiconductor layer may be formed over the substrate 40. The undoped semiconductor layer is free of a p-type dopant or an n-type dopant. In some embodiments, the undoped semiconductor layer includes a compound that contains an element from the "III" group (or family) of the periodic table, and another element from the "V" group (or family) of the periodic table, for example an undoped gallium nitride (GaN) material. The undoped semiconductor layer can serve as a buffer layer (for example, to reduce stress) between the substrate 40 and layers that will be formed over the undoped semiconductor layer. To effectively perform its function as a buffer layer, the undoped semiconductor layer has reduced dislocation defects and good lattice structure quality. In some embodiments, the undoped semiconductor layer has a thickness that is in a range from about 1 um to about 5 um. For reasons of simplicity, the low temperature buffer film is not illustrated herein.

An n-type III-V compound layer 50 is formed over the substrate 40 (or over the un-illustrated undoped semiconductor layer). The n-type III-V compound layer 50 is doped with an n-type dopant such as Carbon (C) or Silicon (Si). The n-type III-V compound layer 50 includes gallium nitride (GaN) in the present embodiment and may thus be referred to as an n-GaN layer as well. In some embodiments, the n-type III-V compound layer 50 has a thickness that is in a range from about 2 um to about 6 um.

A pre-strained layer may be formed over the n-type III-V compound layer 50. The pre-strained layer may be doped with an n-type dopant such as Silicon. In various embodiments, the pre-strained layer may contain a plurality of pairs (for example 20-40 pairs) of interleaving $In_xGa_{1-x}N$ and GaN sub-layers, where x is greater or equal to 0 but less or equal to 1. The pre-strained layer may serve to release strain and reduce a quantum-confined Stark effect (QCSE)—describing the effect of an external electric field upon the light absorption spectrum of a quantum well layer that is formed thereabove. In some embodiments, the pre-strained layer may have an overall thickness in a range from about 30 nanometers (nm) to about 80 nm. For reasons of simplicity, the pre-strained layer is not illustrated herein.

A multiple-quantum well (MQW) layer 60 is formed over the n-type III-V compound layer 50 (or over the un-illustrated pre-strained layer). The MQW layer 60 includes a plurality of alternating (or interleaving) active and barrier sub-layers. For example, the active sub-layers may include indium gallium nitride ($In_xGa_{1-x}N$), and the barrier sub-layers may include gallium nitride (GaN). In some embodiments, the barrier sub-layers may each have a thickness in a range from about 2 nm to about 5 nm, and the active sub-layers may each have a thickness in a range from about 4 nm to about 17 nm.

An electron-blocking layer may be optionally formed over the MQW layer 60. The electron-blocking layer helps confine electron-hole carrier recombination within the MQW layer 60, which may improve quantum efficiency of the MQW layer 60 and reduce radiation in undesired bandwidths. In some embodiments, the electron-blocking layer may include a doped $In_xAl_yGa_{1-x-y}N$ material, where x and y are both greater or equal to 0 but less or equal to 1, and the dopant may include a p-type dopant such as Magnesium. The electron-blocking layer may have a thickness in a range from about 7 nm to about 25 nm. For reasons of simplicity, the electron-blocking layer is not illustrated herein.

A p-type III-V compound layer 70 is formed over the electron blocking layer. The p-type III-V compound layer 70 is doped with a p-type dopant such as Magnesium. The p-type III-V compound layer 70 includes gallium nitride (GaN) in the present embodiment and may thus be referred to as a p-GaN layer. In some embodiments, the p-type III-V compound layer 70 has a thickness that is in a range from about 150 nm to about 200 nm.

The n-type semiconductor layer 50, the MQW layer 60, and the p-type semiconductor layer 70 constitute a core portion of an LED. When an electrical voltage (or electrical charge) is applied to the doped layers (e.g., p-GaN layer and the N-GaN layer) of the LED, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer.

An Ohmic contact layer 80 is formed over the p-type semiconductor layer 70. The Ohmic contact layer 80 contains a thermally-conductive and electrically-conductive material such as metal.

Referring now to FIG. 2 a lithography process is performed to form a plurality of openings or recesses 90 in the layers 50-80. In some embodiments, the lithography process may include one or more deposition, exposing, etching, baking, and rinsing processes (not necessarily performed in that order). The openings 90 divide the layers 50-80 into a plurality of mesa structures. The mesa structures may also be referred to as LED mesa structures.

A reflector layer 100 is then formed over the Ohmic contact layer 80 in each of the LED mesa structures. The reflector layer 100 contains a reflective material capable of reflecting radiation such as light. For example, the reflector layer 100 may contain aluminum, silver, or another suitable metal material. In some embodiments, the reflector layer 100 is configured to reflect light emitted from the LED mesa structures (e.g., light generated by the MQW layer 60) back towards the LED mesa structures.

A barrier layer 110 is formed over the reflector layer 100 in each of the LED mesa structures. In some embodiments, the barrier layer 110 contains a metal material such as Titanium or Nickel. The barrier layer 110 improves adhesive issues that may be associated with the reflector layer 100.

A bond layer 120 is formed over the barrier layer 110 in each of the LED mesa structures. The bond layer 120 contains a metal material suitable for bonding and making electrical and physical contact with another conductive material. The bonding layer 120 may also be referred to as conductive bond pads or bonding pads. Since the bond pads 120, the barrier layers 110, the reflector layer 100, and the Ohmic contact layer are all electrically conductive, electrical access to the p-type semiconductor layer 70 is possible through a connection with the bond pads 120.

Referring now to FIG. 3, a sigulation process is performed to extend the openings 90 further into the substrate 40. In other words, the portion of the substrate 40 beneath each LED mesa structure is separated from other portions of the substrate 40 beneath adjacent LED mesa structures by the sigulation process. The openings 90 are transformed into openings 90A by the sigulation process. At this stage of fabrication, a plurality of p-type vertical LEDs 30A is formed. The p-type vertical LEDs 30A may be considered as semifinished products, as additional processes will be performed (discussed below) that will incorporate the p-type vertical LEDs 30A into a finished LED packaging.

Figure 4:
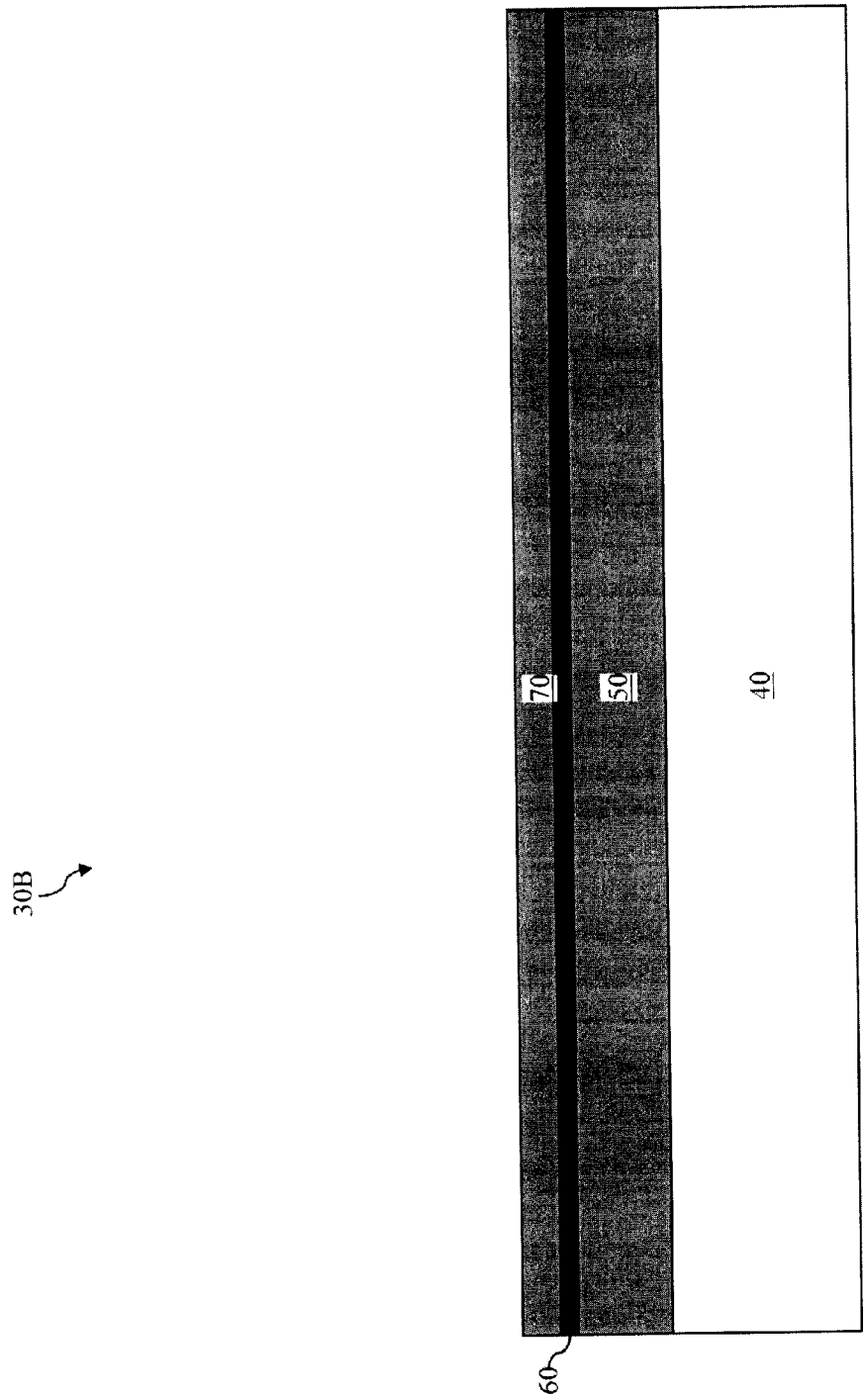

FIGS. 4-8 are diagrammatic cross-sectional views illustrating the formation of an n-type vertical LED 30B. Referring now to FIG. 4, the LED 30B includes a substrate 40 that is similar to the substrate 40 of the p-type LED 30A discussed above. An n-type semiconductor layer 50, an MQW layer 60, and a p-type semiconductor layer 70 (constituting a core portion of the LED) are also formed over the substrate 40. Again, other layers of the LED such as the buffer layer, the pre-strained layer, and the electron-blocking layer are not specifically illustrated herein for reasons of simplicity.

Figure 5:
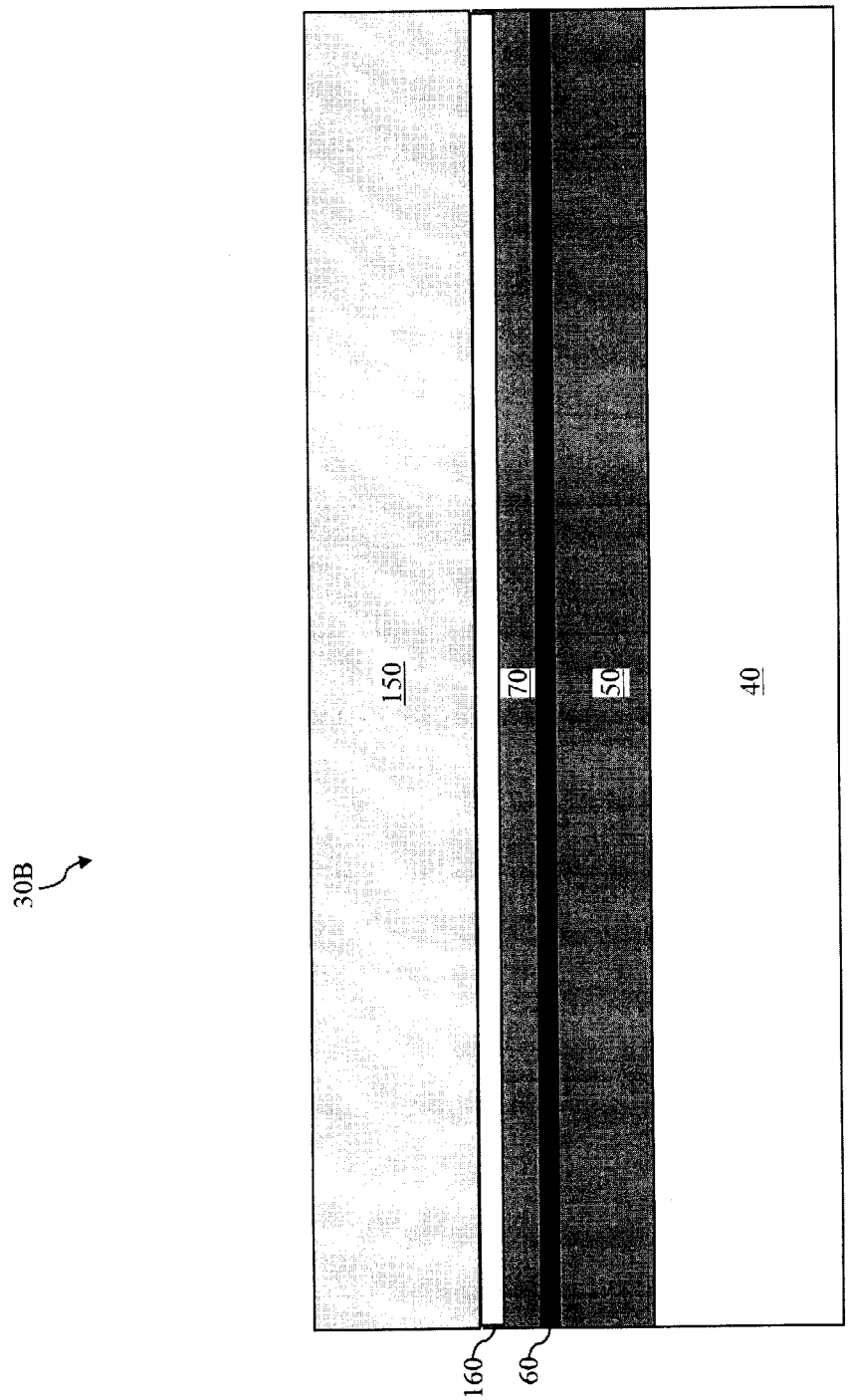

Referring now to FIG. 5, the LED 30B is temporarily bonded to a substrate 150. To facilitate bonding, a bonding buffer layer 160 may be disposed between the substrate 150 and the p-type semiconductor layer 70.

Figure 6:
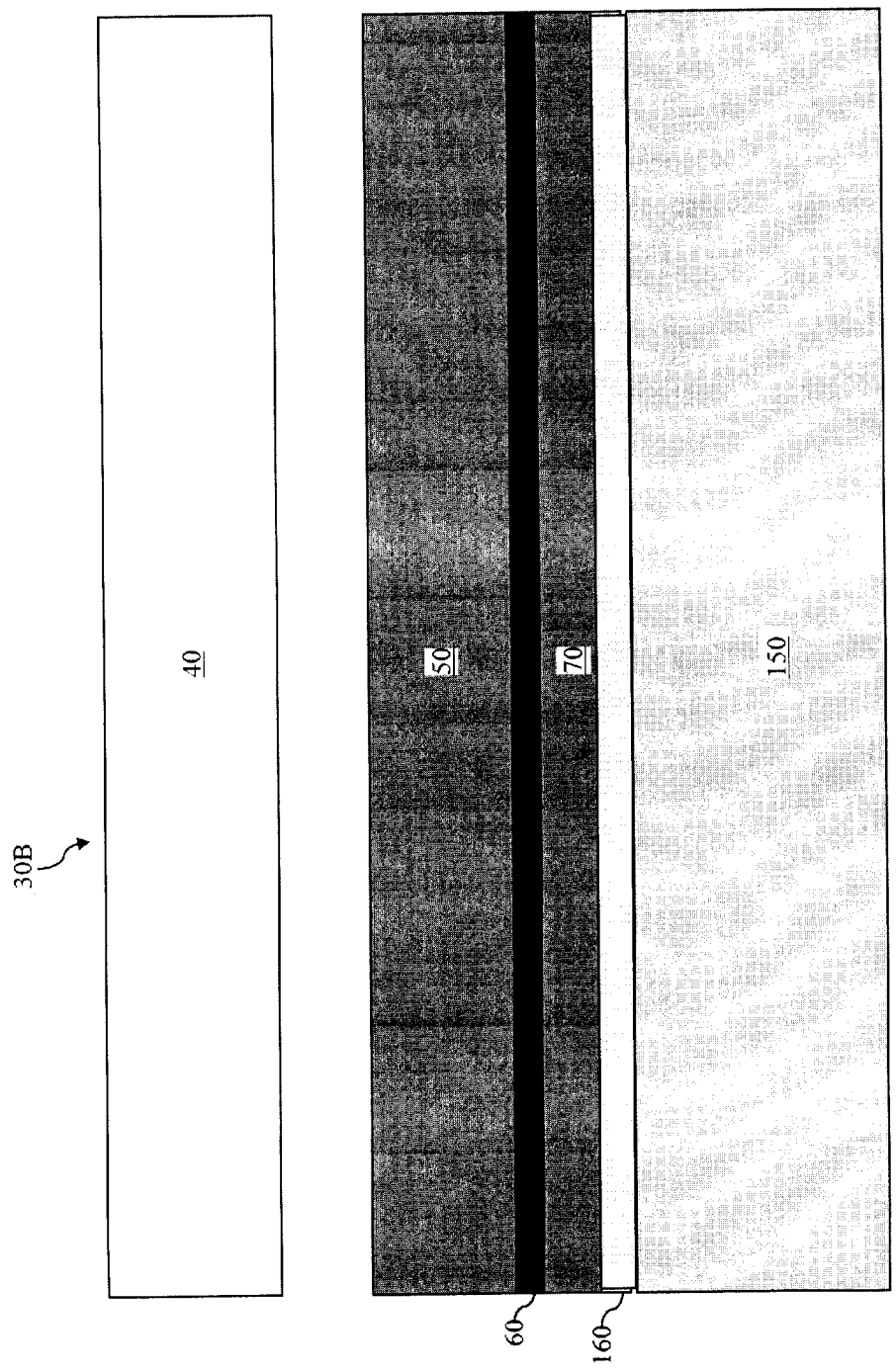

Referring now to FIG. 6, the growth substrate 40 is removed, for example using a laser lift-off process. The substrate 150 now provides support during further processing of the LED 30B. To facilitate the ensuing discussions, the LED 30B is shown as being vertically "flipped" in FIG. 6 and in subsequent Figures. In other words, the substrate 150 is now shown near the bottom of the Figure, and the n-type semiconductor layer 50 is shown near the top of the Figure.

Figure 7:
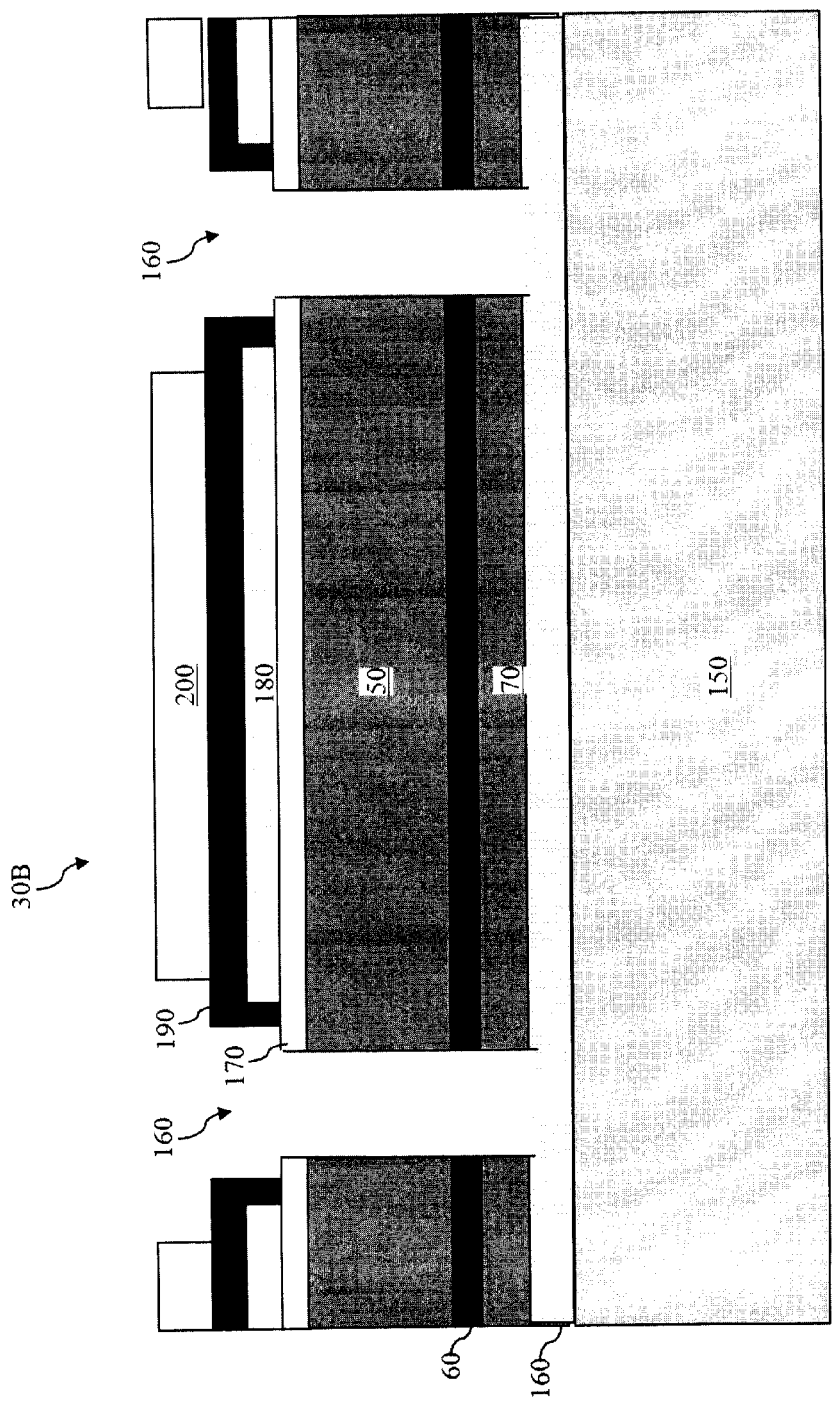

Referring now to FIG. 7, a lithography process is performed to form a plurality of openings or recesses 160 in the layers 50-70. In some embodiments, the lithography process may include one or more deposition, exposing, etching, baking, and rinsing processes (not necessarily performed in that order). The openings 160 divide the layers 50-70 into a plurality of mesa structures. The mesa structures may also be referred to as LED mesa structures.

An Ohmic contact layer 170 is formed over the n-type semiconductor layer 50 in each of the LED mesa structures. The Ohmic contact layer 170 contains a thermally-conductive and electrically-conductive material such as metal.

A reflector layer 180 is then formed over the Ohmic contact layer 170 in each of the LED mesa structures. The reflector layer 180 contains a reflective material capable of reflecting radiation such as light. For example, the reflector layer 180 may contain aluminum, silver, or another suitable metal material. In some embodiments, the reflector layer 180 is configured to reflect light emitted from the LED mesa structures (e.g., light generated by the MQW layer 60) back towards the LED mesa structures.

A barrier layer 190 is formed over the reflector layer 180 in each of the LED mesa structures. In some embodiments, the barrier layer 190 contains a metal material such as Titanium or Nickel.

A bond layer 200 is formed over the barrier layer 190 in each of the LED mesa structures. The bond layer 200 contains a metal material suitable for bonding and making electrical connections with another metal material. The bonding layer 200 may also be referred to as bond pads or bonding pads. Since the bond pads 200, the barrier layers 190, the reflector layer 180, and the Ohmic contact layer 170 are all electrically conductive, electrical access to the n-type semiconductor layer 50 is possible through a connection with the bond pads 200.

Figure 8:
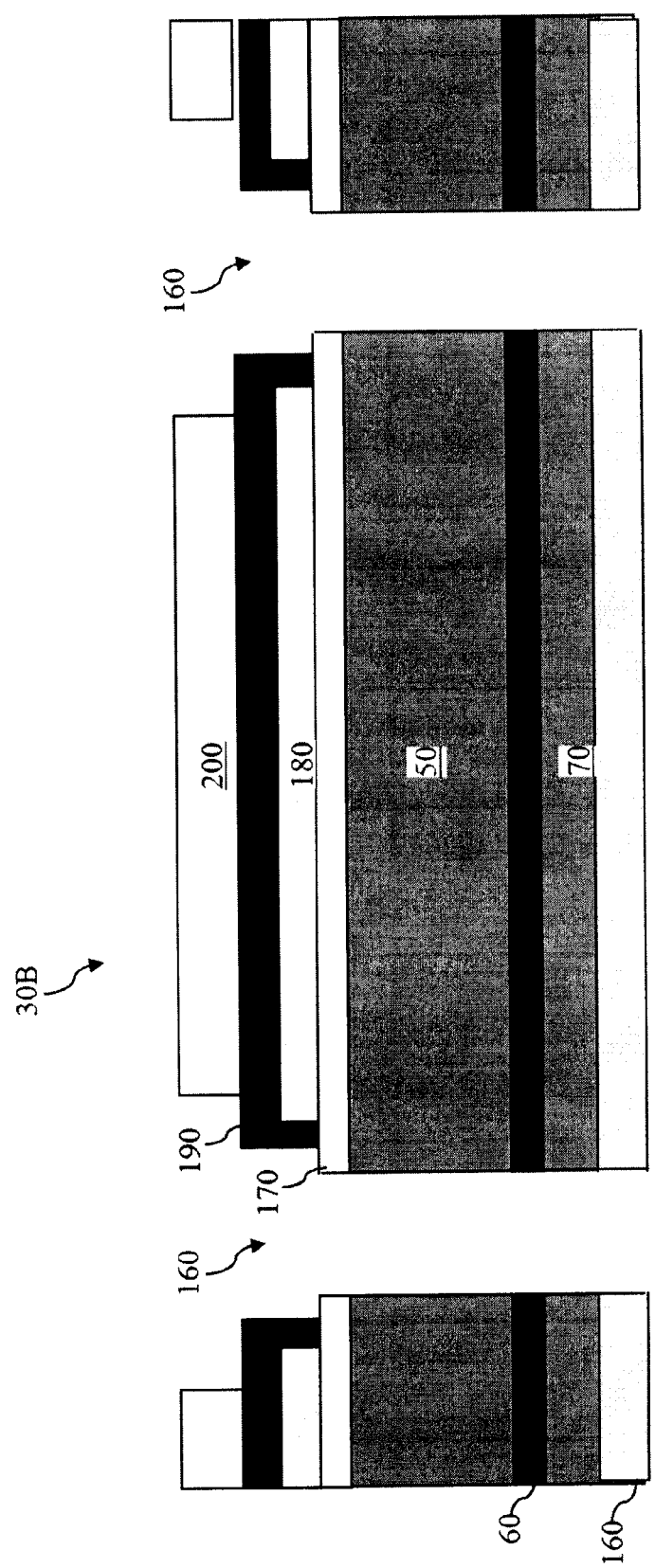

Referring now to FIG. 8, the substrate 150 is removed. At this stage of fabrication, a plurality of n-type vertical LEDs 30B is formed. The n-type vertical LEDs 30B may be considered as semi-finished products, as additional processes will be performed (discussed below) that will incorporate the n-type vertical LEDs 30B into a finished LED-based lighting product.

Figure 9:
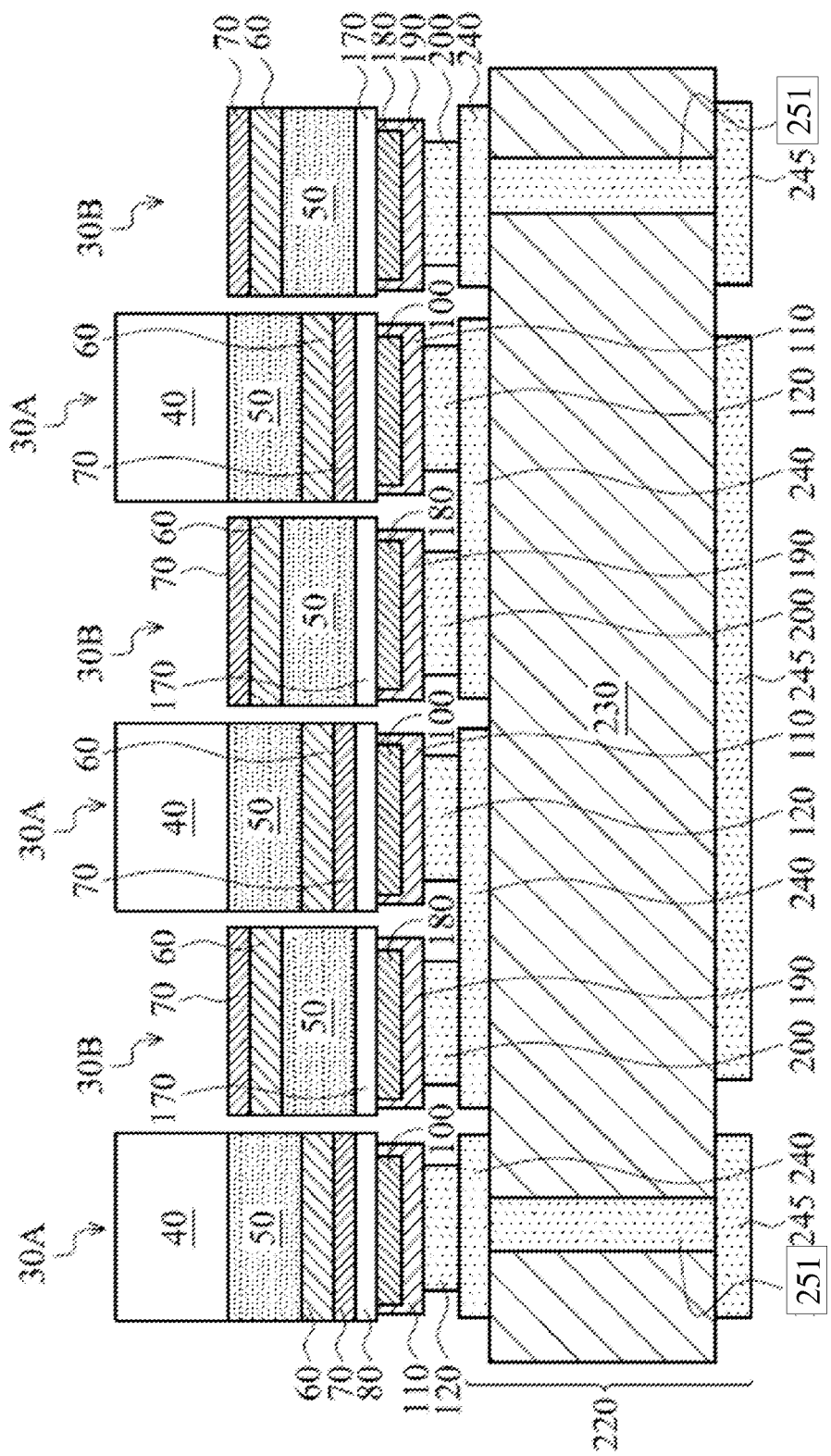

Referring now to FIG. 9, a plurality of both the p-type vertical LEDs 30A and the n-type vertical LEDs 30B are bonded to a submount 220. In various embodiments, the submount 220 may be a silicon submount, a ceramic submount, a Printed Circuit Board (PCB) submount, or another suitable submount. The submount 220 includes a substrate 230, a plurality of bond pads 240 located on one side of the substrate 230, a plurality of bond pads 245 located on the opposite side of the substrate 230, and a plurality of through-silicon vias (TSVs) 251 extending through the substrate 230 and interconnect some of the bond pads 240 with some of the other bond pads 245. The plurality of the p-type vertical LEDs 30A and the n-type vertical LEDs 30B are bonded to the submount 220 through the bond pads 240. A subset of the bond pads 240 (e.g., the two middle bond pads 240 shown in FIG. 9) are also used to electrically couple together neighboring p-type and n-type vertical LEDs 30A-30B.

Figure 10:
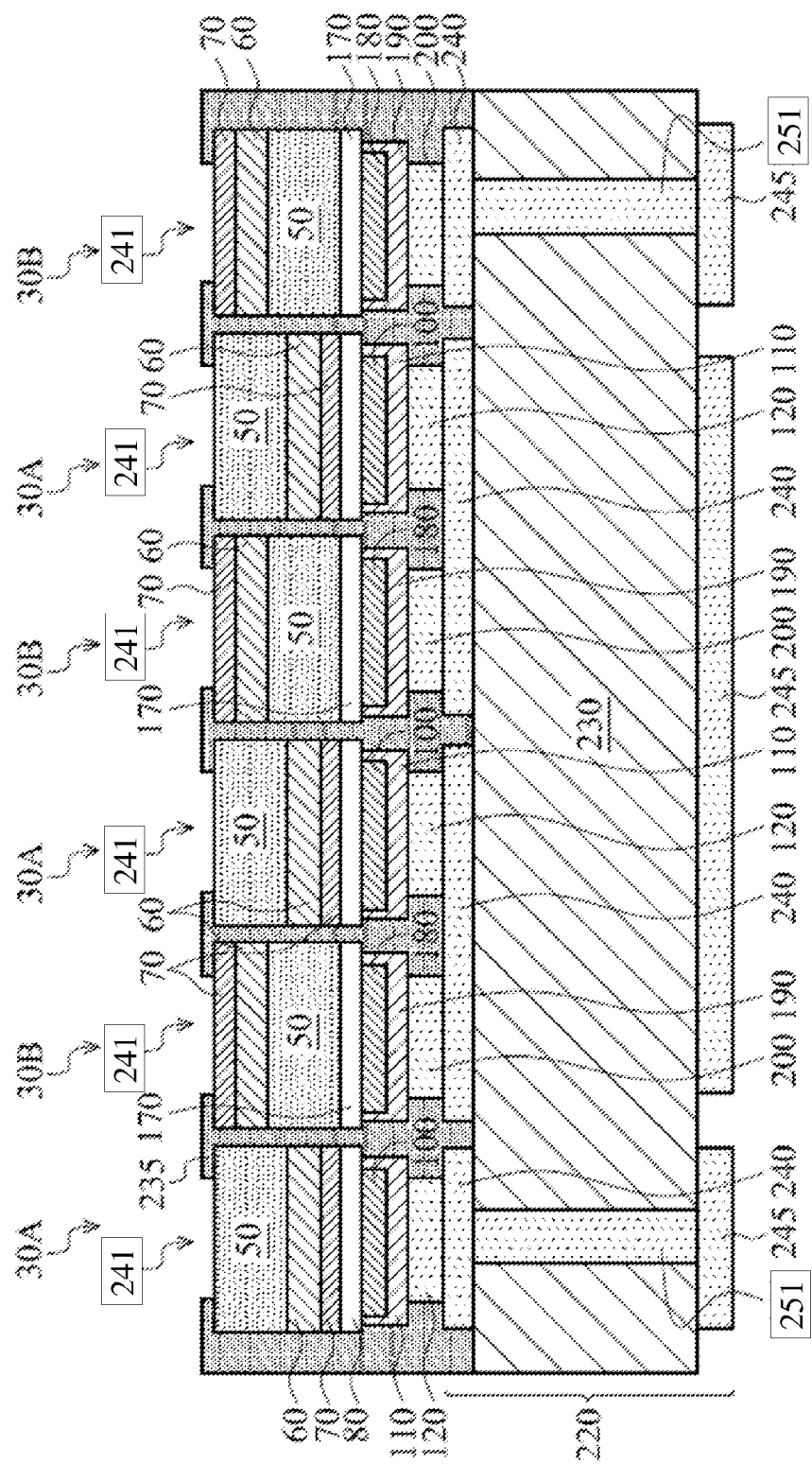

Referring now to FIG. 10, the growth substrates 40 are removed from the p-type vertical LEDs 30A, for example through a laser lift-off process. Thereafter, a transparent layer 235 is formed around both the p-type vertical LEDs 30A and the n-type LEDs 30B. In some embodiments, the transparent layer 235 includes liquid materials such as dielectrics or photoresist. In some embodiments, the transparent layer 235 is formed by a spin-on-glass (SOG) process. An optional thermal step may be added after the transparent layer 235. The transparent layer 235 may be planarized to have a smooth exposed surface. A plurality of openings 241 are then formed in the transparent layer 235 so as to expose a portion of each of the p-type vertical LEDs 30A and the n-type vertical LEDs 30B. As a result, the openings 241 expose the n-type semiconductor layers 50 of the p-type vertical LEDs 30A, as well as the p-type semiconductor layers 70 of the n-type vertical LEDs 30B.

Figure 11:
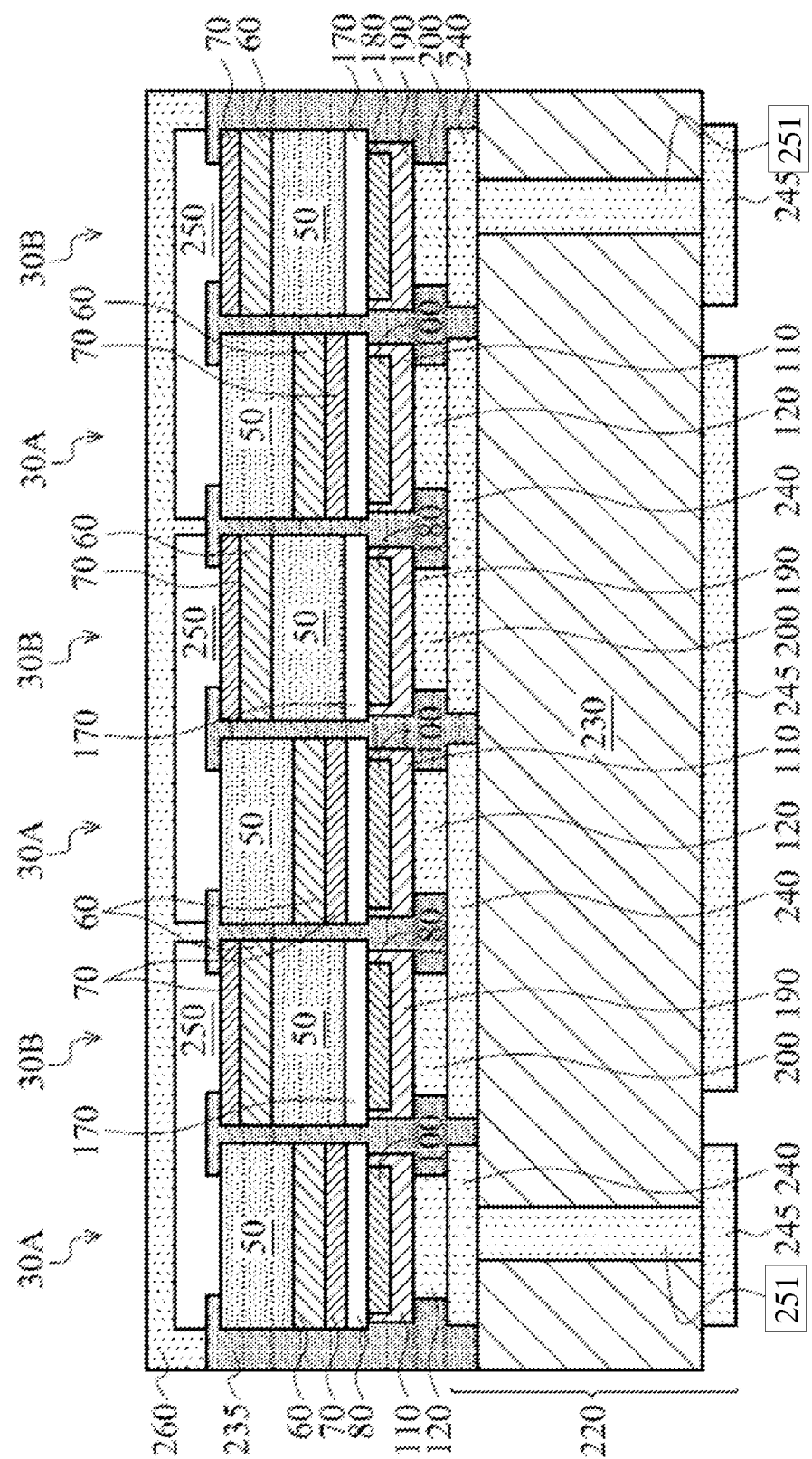

Referring now to FIG. 11, a plurality of transparent cladding layer (TCL) components 250 is formed to fill the openings 241. Each of the TCL components 250 spans laterally to cover one of the p-type LEDs 30A as well as one of the n-type LEDs 30B. The TCL components 250 each contain a transparent and yet electrically conductive material. As such, each TCL component 250 electrically couples together a pair of neighboring LEDs: a p-type vertical LED 30A and an n-type vertical LED 30B. In other words, the n-type semiconductor layer 50 of the p-type vertical LED 30A and the p-type semiconductor layer 70 of the n-type vertical LED 30B are electrically coupled together by the TCL component 250. In some embodiments, the materials of the TCL component 250 may include: tin-doped indium oxide, aluminum doped zinc-oxide, indium-doped cadmium-oxide, transparent conducting polymers such as polyacetylene, polyaniline, polypyrrole or polythiophenes, poly(3,4-ethylenedioxythiophene) (PEDOT), PEDOT: poly(styrene sulfonate), or carbon nanotubes.

A phosphor material 260 is then formed over the transparent layer 235 and over the TCL components 250. The phosphor material 260 may include either phosphorescent materials and/or fluorescent materials. The phosphor material 260 may be used to transform the color of the light emitted by the p-type and n-type vertical LEDs 30A-30B. By changing the material composition of the phosphor material 260, the desired light color may be achieved.

Figure 12:
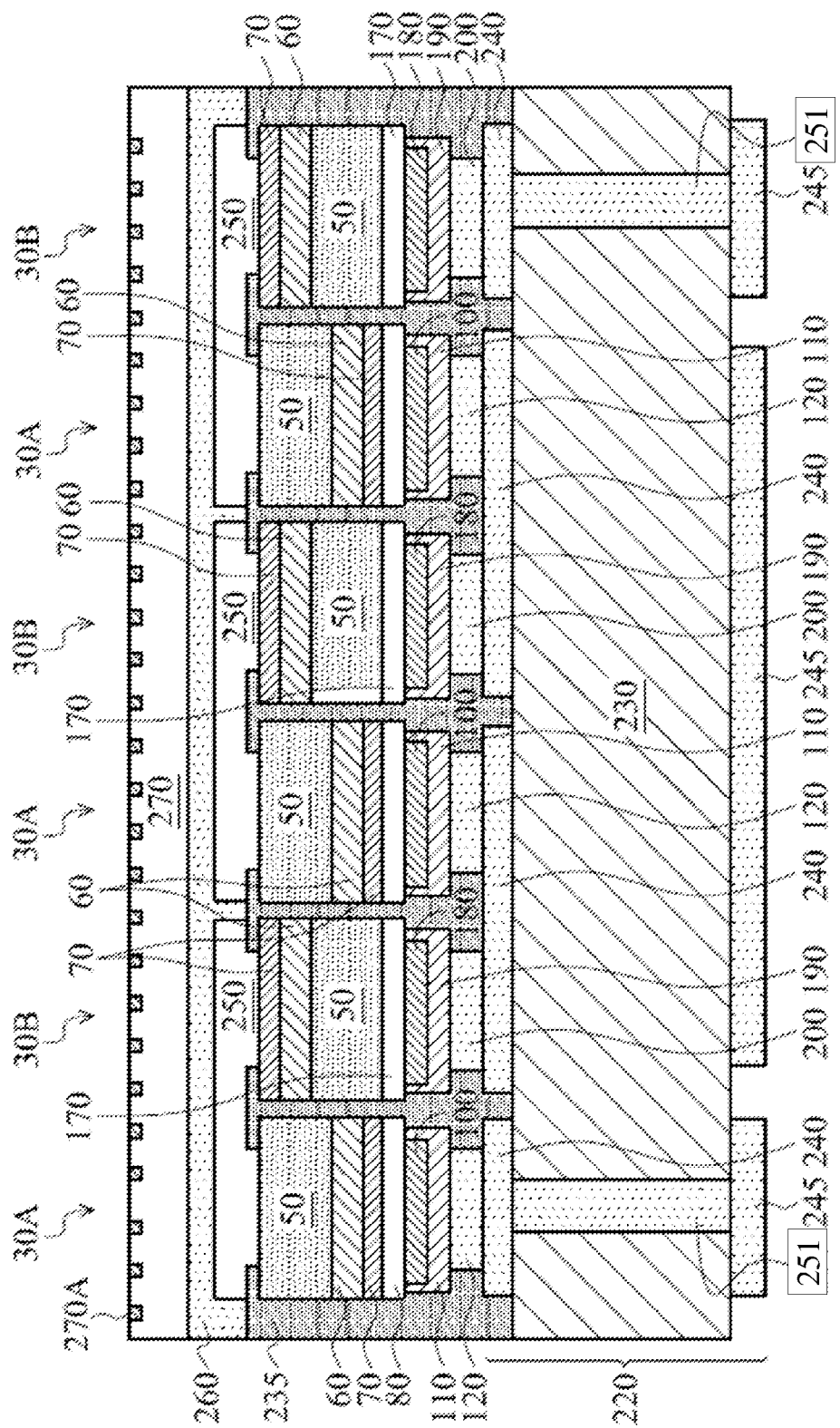

Referring now to FIG. 12, a protection layer 270 may be formed over the phosphor material 260. The protection layer 270 protects the various components underneath from contaminants such as dust or moisture. In some embodiments, the protection layer 270 includes glue, glass, dielectrics such as silicon oxide, silicon oxynitride or silicon nitride and other transparent materials. Also, the protection layer 270 may undergo a surface roughening process so that its upper surface 270A becomes textured. The textured upper surface 270A helps scatter the light generated by the LEDs 30A-30B, thereby increasing the light distribution uniformity.

Figure 13:
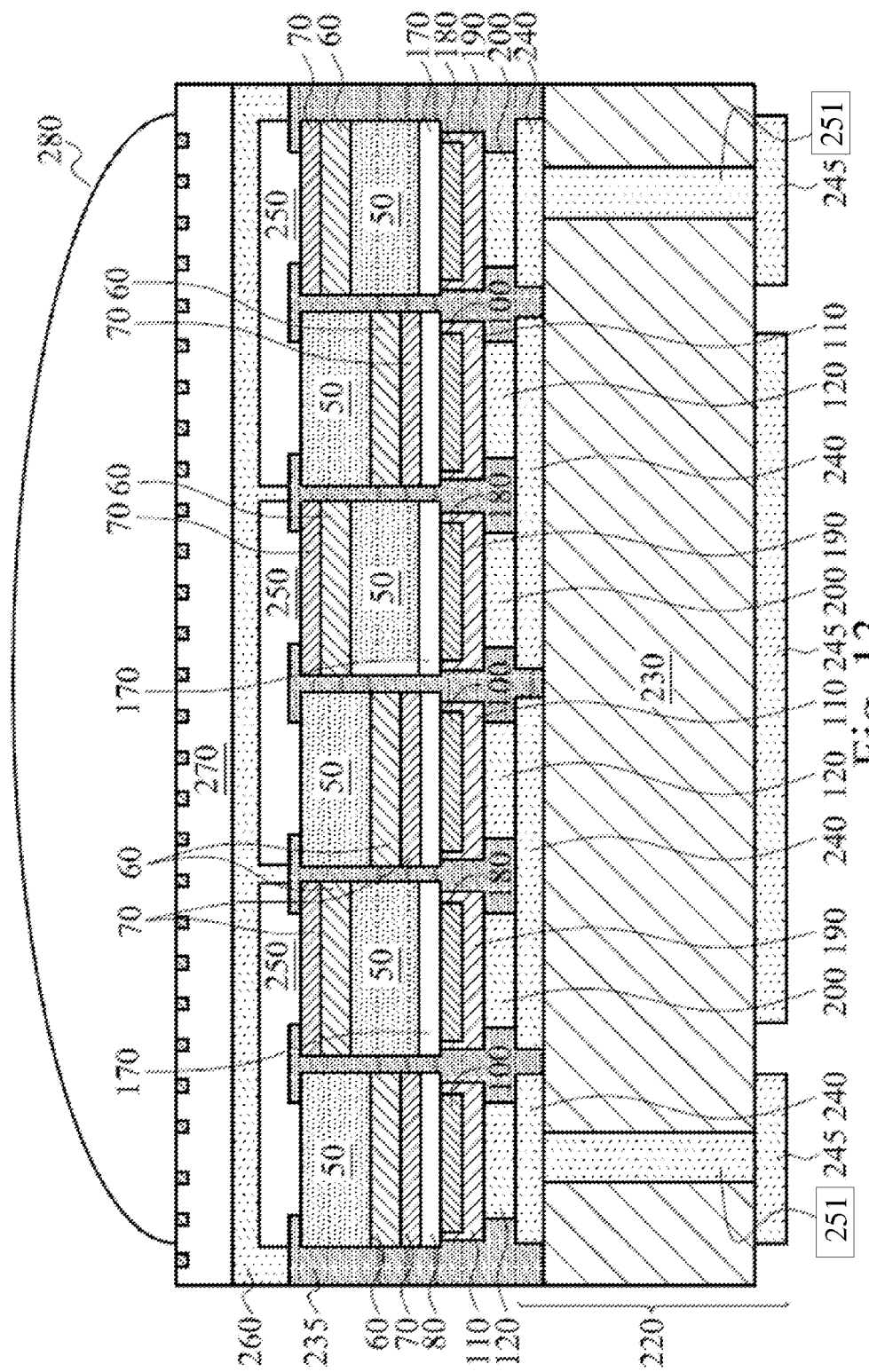
Figure 14:
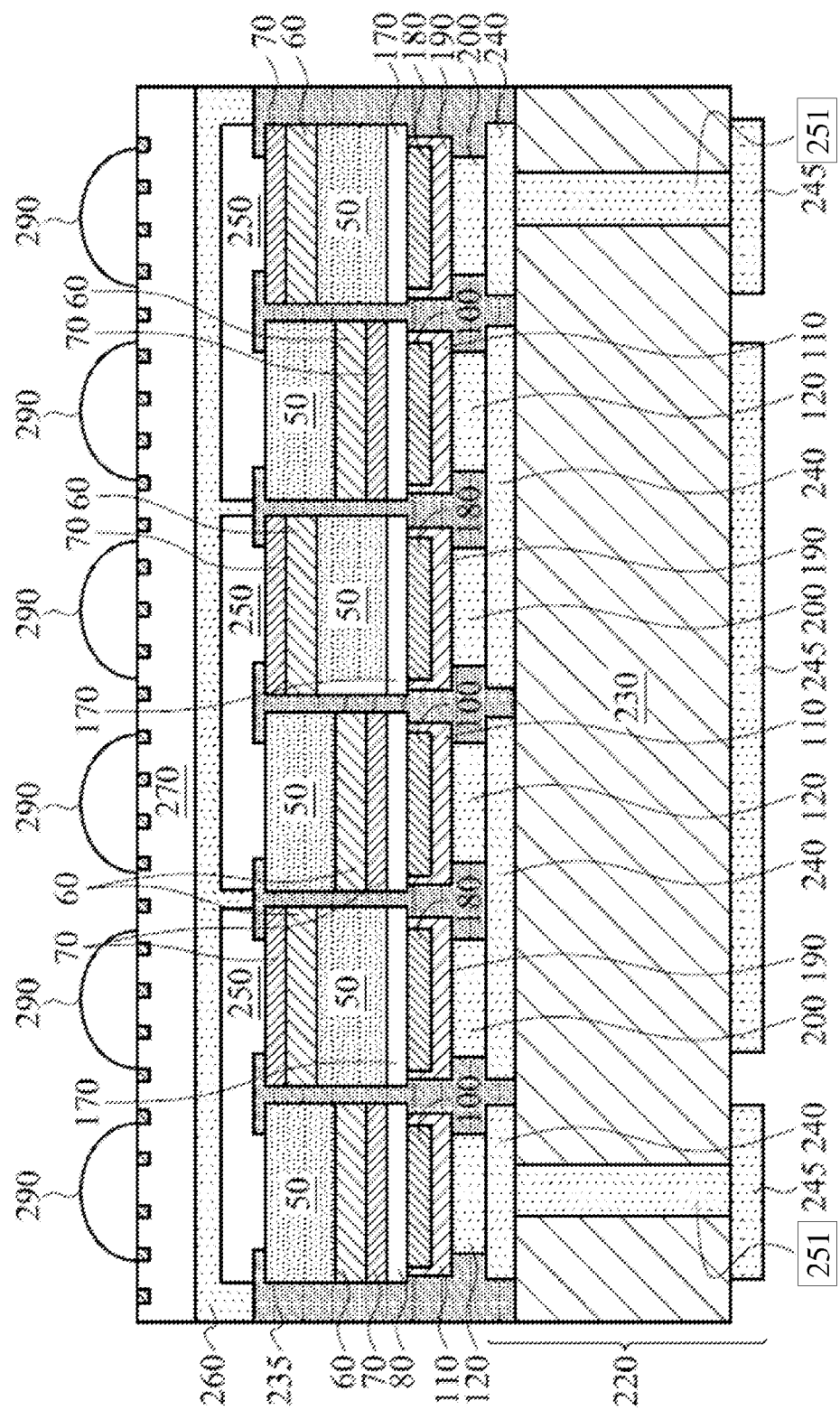

FIGS. 13 and 14 illustrate different dome structure embodiments for the p-type and n-type vertical LEDs 30A-30B. In FIG. 13, a lens 280 is formed over the protection layer 270. The lens 280 may also be referred to as a large sense, since it covers multiple pairs of the p-type and n-type vertical LEDs 30A-30B. In FIG. 14, a plurality of smaller lenses 200 are formed over the protection layer 270. The lenses 290 may also be referred to as micro-lenses, since each one of the micro-lenses covers a different LED 30A or 30B. The dome structure configuration is not necessarily limited to the two embodiments shown in FIGS. 13-14, however, and other types of lenses may be used in alternative embodiments.

Based on the discussions above with reference to FIGS. 1-14, it can be seen that the present disclosure offers an LED packaging structure that eliminates the bond wires that were typically required by conventional LED packaging schemes for interconnecting LEDs. Instead, the present disclosure bonds a plurality of p-type and n-type vertical LEDs 30A-30B to a submount 220. The p-type and n-type LEDs 30A-30B are bonded in alternating or periodic pairs (e.g., in a p-n-p-n-p-n configuration). A plurality of electrically-conductive transparent cladding layer (TCL) components 250 are then used to electrically couple each pair of neighboring p-type and n-type LEDs 30A-30B.

For example, an n-type semiconductor layer 50 of a p-type LED 30A may be electrically coupled with a p-type semiconductor layer 70 of an n-type LED 30B by a TCL component 250. In addition, the electrically conductive bond pads 240 disposed on the substrate 230 of the submount 220 may be used to electrically couple different pairs of the LEDs together. For example, an n-type semiconductor layer 50 of an n-type LED 30B may be electrically coupled with a p-type semiconductor layer 70 of a p-type LED 30A by a bond pad 240 (as well as the other electrically conductive components between the LEDs 30A-30B and the bond pad 240). As such, the plurality of p-type and n-type vertical LEDs can be interconnected together. In the illustrated embodiments, the p-type and n-type vertical LEDs 30A-30B are all electrically coupled together in series. However, they may also be electrically coupled together in parallel in other embodiments.

The elimination of bond wires by the LED packaging structure of the present disclosure offers advantages over conventional packaging structures. It is understood, however, that different embodiments of this LED packaging structure may offer different advantages, not all advantages are necessarily discussed herein, and no particular advantage is required for all embodiments.

One advantage of the LED packaging structure of the present disclosure involves improved light output, for example a greater lumen density. In conventional LED packaging structures, the bond wires may obstruct the light path and/or lead to a smaller effective LED light-generating area, thereby reducing the light output. In comparison, the present disclosure eliminates the bond wires through implementing the alternating multiple n-type and p-type vertical LEDs as discussed above. Each LED has a substantially unobstructed light path, which allows the LEDs of the present disclosure to have better light output and a greater lumen density.

Another advantage of the LED packaging structure of the present disclosure involves lower costs. As discussed above, the elimination of the bond wires saves not only material costs for the bond wires, but also the fabrication-related costs for having to attach the bond wires. The fabrication of the p-type and n-type vertical LEDs and their subsequent bonding to the submount are compatible with current processing flow and does not require additional expensive fabrication equipment. Furthermore, bond wires may suffer from a higher failure rate than the electrical interconnection scheme disclosed herein. Therefore, the LED packaging of the present disclosure is more robust and durable. In addition, the present LED packaging scheme allows a plurality of LEDs to be closely spaced apart, thereby enhancing the density of LEDs in a given package. The increased LED density also helps reduce costs.

Yet another advantage of the LED packaging structure of the present disclosure involves its versatility for different types of applications. For example, since a plurality of LEDs can easily be electrically coupled together in series, they can be used in a high-voltage LED application that needs to handle voltages as high as about 50 volts to about 250 volts. Similarly, they can be used for an alternating current (AC) application, which may also involve the use of high voltages. Furthermore, the increased LED density may allow the LEDs to be used in a device requiring a high density light source.

It is understood that additional advantages may be offered by the LED packaging structure of the present disclosure, but they are not discussed herein for reasons of simplicity.

Figure 15:
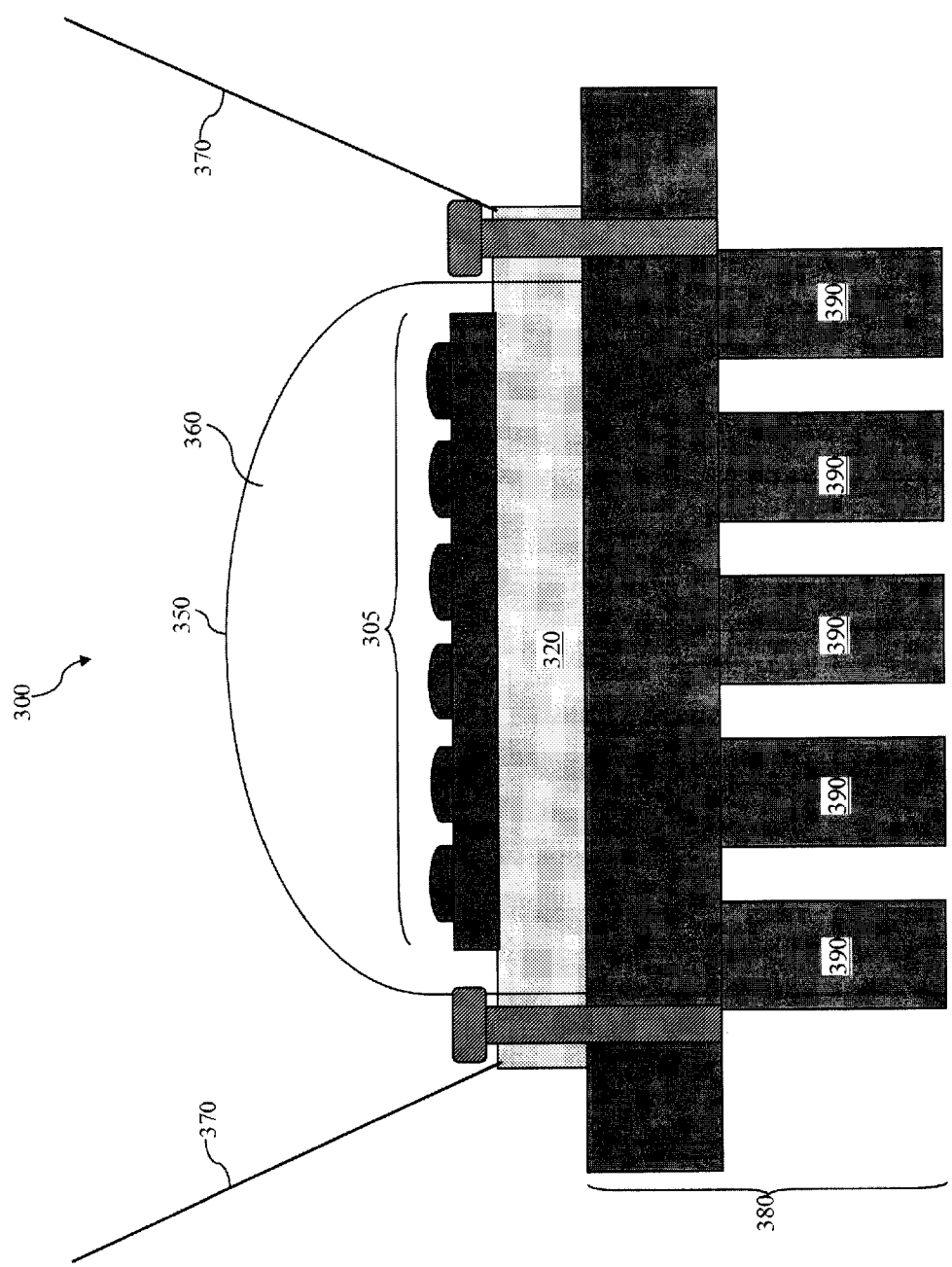
FIG. 15 is a diagrammatic cross-sectional side view of a lighting module that includes the LED packaging structure shown in FIGS. 1-14 according to various aspects of the present disclosure.

The LED packaging structure discussed above can be implemented as a part of a lighting apparatus. For example, the plurality of alternating n-type and p-type vertical LEDs may be implemented as a part of a LED-based lighting instrument 300, a simplified cross-sectional view of which is shown in FIG. 15. The embodiment of the LED-based lighting instrument 300 shown in FIG. 15 includes a plurality of alternating n-type and p-type vertical LEDs, shown collectively herein as an LED structure 305. The LEDs (or a selected subset thereof) are electrically coupled together in series.

As discussed above, each of the vertical LEDs in the LED structure 305 includes an n-doped III-V group compound layer, a p-doped III-V group compound layer, and a MQW layer disposed between the n-doped and p-doped III-V compound layers. Due to the configuration and the interconnection of these LEDs as discussed above, the LED structure 305 offer better light output, greater LED density, more flexible and durable electrical interconnections, and reduced costs compared to traditional LEDs.

In some embodiments, the LEDs each have a phosphor layer (such as the phosphor material 260 shown in FIG. 11) coated thereon. The phosphor layer may include either phosphorescent materials and/or fluorescent materials. The phosphor layer may be coated on the surfaces of the LEDs in a concentrated viscous fluid medium (e.g., liquid glue). As the viscous liquid sets or cures, the phosphor material becomes a part of the LED package. In practical LED applications, the phosphor layer may be used to transform the color of the light emitted by an LED. For example, the phosphor layer can transform a blue light emitted by an LED into a different wavelength light. By changing the material composition of the phosphor layer, the desired light color may be achieved.

The LED structure 305 is mounted on a submount 320. In some embodiments, the submount 320 is similar to the submount 220 (shown in FIG. 9) discussed above. For example, the submount 320 may include a Metal Core Printed Circuit Board (MCPCB) substrate and a plurality of electrically conductive bond pads located on the MCPCB. The MCPCB includes a metal base that may be made of aluminum (or an alloy thereof). The MCPCB also includes a thermally conductive but electrically insulating dielectric layer disposed on the metal base. The MCPCB may also include a thin metal layer made of copper that is disposed on the dielectric layer. In alternative embodiments, the submount 320 may include other suitable thermally conductive structures such as silicon submounts or ceramic submounts.

The lighting instrument 300 includes a diffuser cap 350. The diffuser cap 350 provides a cover for the LED structure 305 therebelow. Stated differently, the LED structure 305 is encapsulated by the diffuser cap 350 and the substrate 320 collectively. In some embodiments, the diffuser cap 350 has a curved surface or profile. In some embodiments, the curved surface may substantially follow the contours of a semicircle, so that each beam of light emitted by the LEDs of the LED structure 305 may reach the surface of the diffuser cap 350 at a substantially right incident angle, for example, within a few degrees of 90 degrees. The curved shape of the diffuser cap 350 helps reduce Total Internal Reflection (TIR) of the light emitted by the LEDs of the LED structure 305.

The diffuser cap 350 may have a textured surface. For example, the textured surface may be roughened, or may contain a plurality of small patterns such as polygons or circles. Such textured surface helps scatter the light emitted by the LEDs of the LED structure 305 so as to make the light distribution more uniform. In some embodiments, the diffuser cap 350 is coated with a diffuser layer containing diffuser particles.

In some embodiments, a space 360 between the LED structure 305 and the diffuser cap 350 is filled by air. In other embodiments, the space 360 may be filled by an optical-grade silicone-based adhesive material, also referred to as an optical gel. Phosphor particles may be mixed within the optical gel in that embodiment so as to further diffuse light emitted by the LEDs of the LED structure 305.

Though the illustrated embodiment shows all of the LEDs of the LED structure 305 being encapsulated within a single diffuser cap 350, it is understood that a plurality of diffuser caps may be used in other embodiments. For example, each of the LEDs of the LED structure 305 may be encapsulated within a respective one of the plurality of diffuser caps.

The lighting instrument 300 may also optionally include a reflective structure 370. The reflective structure 370 may be mounted on the substrate 320. In some embodiments, the reflective structure is shaped like a cup, and thus it may also be referred to as a reflector cup. The reflective structure encircles or surrounds the LED structure 305 and the diffuser cap 350 in 360 degrees from a top view. From the top view, the reflective structure 370 may have a circular profile, a beehive-like hexagonal profile, or another suitable cellular profile encircling the diffuser cap 350. In some embodiments, the LED structure 305 and the diffuser cap 350 are situated near a bottom portion of the reflective structure 370. Alternatively stated, the top or upper opening of the reflective structure 370 is located above or over the LED structure 305 and the diffuser cap 350.

The reflective structure 370 is configured to reflect light that propagates out of the diffuser cap 350. In some embodiments, the inner surface of reflective structure 370 is coated with a reflective film, such as aluminum, silver, or alloys thereof. It is understood that the surface of the sidewalls of the reflective structure 370 may be textured in some embodiments, in a manner similar to the textured surface of the diffuser cap 350. Hence, the reflective structure 370 is operable to perform further scattering of the light emitted by the LED of the LED structure 305, which reduces glare of the light output of the lighting instrument 300 and makes the light output friendlier to the human eye. In some embodiments, the sidewalls of the reflective structure 370 have a sloped or tapered profile. The tapered profile of the reflective structure 370 enhances the light reflection efficiency of the reflective structure 370.

The lighting instrument 300 includes a thermal dissipation structure 380, also referred to as a heat sink 380. The heat sink 380 is thermally coupled to the LED structure 305 (which generate heat during operation) through the substrate 320. In other words, the heat sink 380 is attached to the substrate 320, or the substrate 320 is located on a surface of the heat sink 380. The heat sink 380 is configured to facilitate heat dissipation to the ambient atmosphere. The heat sink 380 contains a thermally conductive material, such as a metal material. The shape and geometries of the heat sink 380 are designed to provide a framework for a familiar light bulb while at the same time spreading or directing heat away from the LED structure 305. To enhance heat transfer, the heat sink 380 may have a plurality of fins 390 that protrude outwardly from a body of the heat sink 380. The fins 390 may have substantial surface area exposed to ambient atmosphere to facilitate heat transfer.

Figure 16:
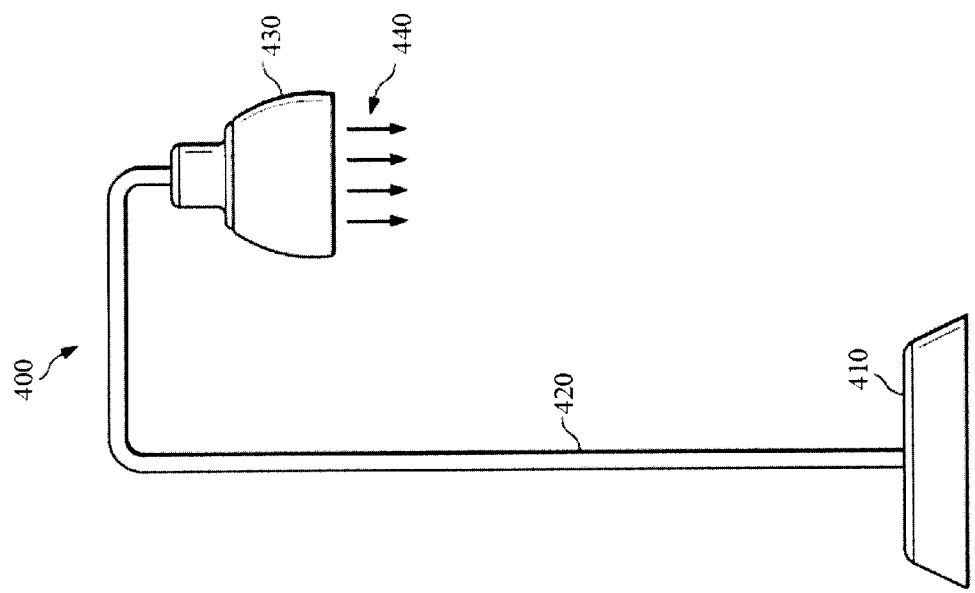
FIG. 16 is a diagrammatic view of a lighting module that includes the LED lighting apparatus of FIG. 15 according to various aspects of the present disclosure.

FIG. 16 illustrates a simplified diagrammatic view of a lighting module 400 that includes some embodiments of the lighting instrument 300 discussed above. The lighting module 400 has a base 410, a body 420 attached to the base 410, and a lamp 430 attached to the body 420. In some embodiments, the lamp 430 is a down lamp (or a down light lighting module). The lamp 430 includes the lighting instrument 300 discussed above with reference to FIG. 15. The lamp 430 is operable to efficiently project light beams 440. In addition, the lamp 430 can offer greater durability and longer lifetime compared to traditional incandescent lamps. It is understood that other lighting applications may benefit from using the LEDs of the present disclosure discussed above. For example, the LEDs of the present disclosure may be used in lighting applications including, but not limited to, vehicle headlights or taillights, vehicle instrument panel displays, light sources of projectors, light sources of electronics such as Liquid Crystal Display (LCD) televisions or LCD monitors, tablet computers, mobile telephones, or notebook/laptop computers.

Figure 17:
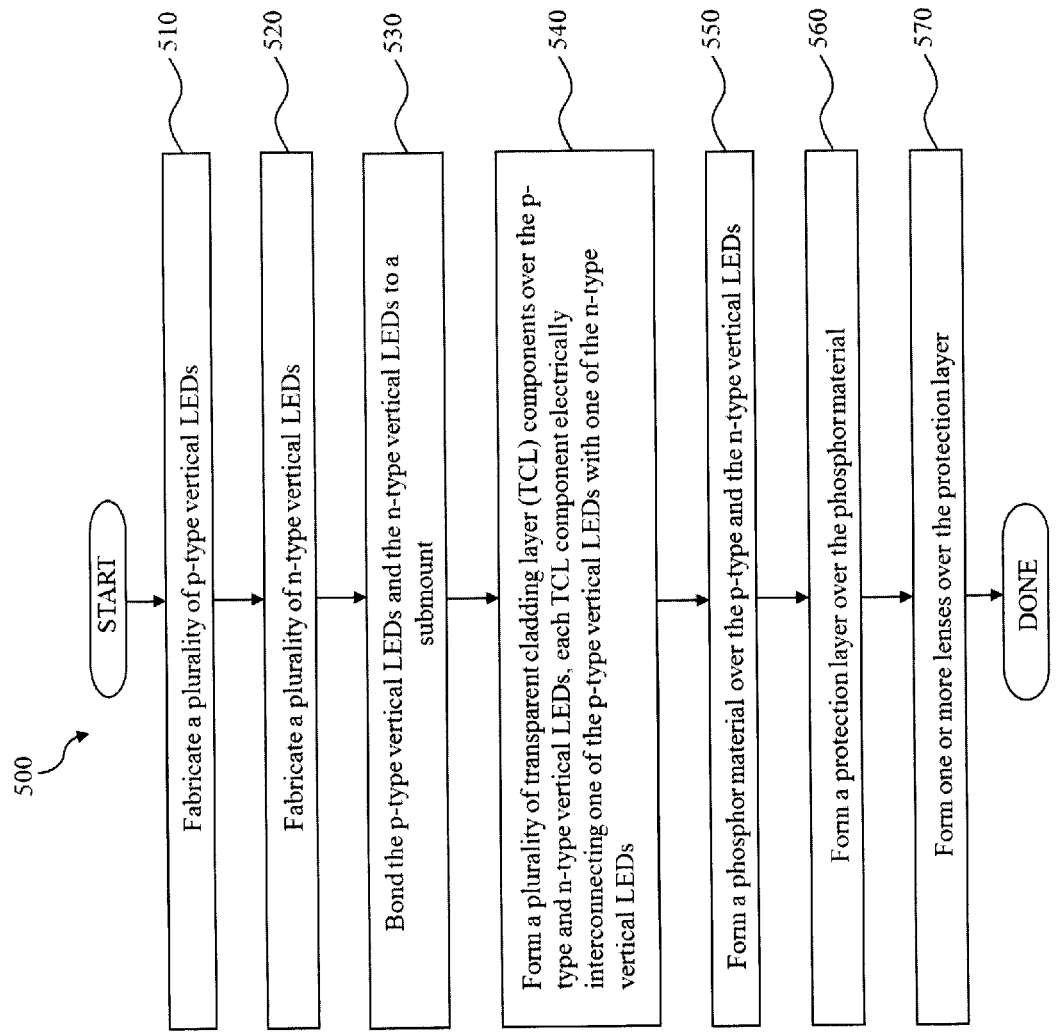
FIG. 17 is a flowchart illustrating a method of packaging LEDs according to various aspects of the present disclosure.

FIG. 17 is a flowchart illustrating a simplified method 500 of packaging LEDs. The method 500 includes a step 510, in which a plurality of p-type vertical LEDs is fabricated. In some embodiments, the step 510 includes the following sub-steps: a plurality of epi-layers is grown over a growth substrate. The epi-layers include an n-type semiconductor layer, a p-type semiconductor layer, and a multiple-quantum-well (MQW) layer disposed between the n-type and p-type semiconductor layers. An Ohmic contact layer is formed over the epi-layers. A plurality of openings is formed in the Ohmic contact layer and the epi-layers, thereby forming a plurality of mesa structures that are separated from one another by the openings. A reflector layer is formed over the Ohmic contact layer in each of the mesa structures. A barrier layer is formed over the reflector layer in each of the mesa structures. A bonding pad is formed over the barrier layer in each of the mesa structures. A sigulation process is performed to extend the openings through the growth substrate, thereby forming a plurality of separated p-type vertical LEDs.

The method 500 includes a step 520, in which a plurality of b-type vertical LEDs is fabricated. It is understood that the steps 510 and 520 need not necessarily be performed in a particular order. That is, the step 510 may be performed before the step 520, or vice versa. In some embodiments, the step 510 includes the following sub-steps: a plurality of epi-layers is grown over a growth substrate. The epi-layers include an n-type semiconductor layer, a p-type semiconductor layer, and a multiple-quantum-well (MQW) layer disposed between the n-type and p-type semiconductor layers. A carrier substrate is bonded to the growth substrate and the epi-layers disposed thereon. Thereafter, the growth substrate is removed. A plurality of openings is formed in the epi-layers, thereby forming a plurality of mesa structures that are separated from one another by the openings. An Ohmic contact layer is formed over the n-type semiconductor layer in each of the mesa structures. A reflector layer is formed over the Ohmic contact layer in each of the mesa structures. A barrier layer is formed over the reflector layer in each of the mesa structures. A bonding pad is formed over the barrier layer in each of the mesa structures. A sigulation process is performed to extend the openings through the carrier substrate, thereby forming a plurality of separated n-type vertical LEDs.

The method 500 includes a step 530, in which the p-type and n-type LEDs are bonded to a submount. The submount includes a substrate (e.g., a PCB substrate, a silicon substrate, a ceramic substrate, etc) and plurality of bonding pads located on the substrate. The p-type and n-type vertical LEDs are bonded to the submount through the bonding pads. At least a subset of the bonding pads are each configured to electrically interconnect one of the p-type vertical LEDs with a neighboring one of the n-type vertical LEDs.

The method 500 includes a step 540, in which a plurality of transparent cladding layer (TCL) components is formed over the p-type and n-type vertical LEDs. Each TCL component electrically interconnects one of the p-type vertical LEDs with one of the n-type vertical LEDs.

The method 500 includes a step 550, in which a phosphor material is formed over the p-type and the n-type vertical LEDs.

The method 500 includes a step 560, in which a protection layer is formed over the phosphor material.

The method 500 includes a step 570, in which one or more lenses are formed over the protection layer.

Additional processes may be performed before, during, or after the steps 510-570 discussed herein to complete the packaging of the LEDs. These other processes are not discussed in detail herein for reasons of simplicity.

One aspect the present disclosure involves a light-emitting diode (LED) packaging structure. The LED packaging structure includes: a submount substrate; a plurality of conductive pads located on the submount substrate; and a plurality of LEDs bonded to the submount substrate through the plurality of conductive pads, wherein the plurality of LEDs includes p-type vertical LEDs and n-type vertical LEDs that are arranged in an alternating manner. The p-type and n-type vertical LEDs each include a respective p-type doped semiconductor layer and an n-type doped semiconductor layer; for the p-type vertical LED, the p-type doped semiconductor layer is located closer to the submount substrate than the n-type doped semiconductor layer; and for the n-type vertical LED, the n-type doped semiconductor layer is located closer to the submount substrate than the p-type doped semiconductor layer In some embodiments, the LED packaging structure further includes: a plurality of transparent cladding layer (TCL) components disposed over the plurality of LEDs. Each TCL component is configured to electrically couple together one of the p-type vertical LEDs with an adjacent one of the n-type vertical LEDs.

In some embodiments, the LED packaging structure is free of bond wires.

In some embodiments, a subset of the bond pads are each configured to electrically couple together a p-type vertical LED and an adjacent n-type vertical LED.

In some embodiments,. The LED packaging structure further includes: a phosphor film disposed over the plurality of LEDs; and a protective layer disposed over the phosphor film, the protective layer having a roughened surface.

In some embodiments, the LED packaging structure further includes: one or more lenses disposed over the plurality of LEDs, wherein the one or more lenses and the submount substrate are disposed on opposite sides of the LEDs.

In some embodiments, the plurality of conductive pads include a first subset of conductive pads located on a first surface of the submount substrate and a second subset of conductive pads located on a second surface of the submount substrate opposite the first surface; and the submount substrate contains a plurality of through-silicon-vias that electrically interconnect the second subset of the conductive pads with some of the first subset of the conductive pads.

Another aspect of the present disclosure involves a photonic lighting apparatus. The photonic lighting apparatus includes: a submount including a substrate and a plurality of bond pads disposed on the substrate; a plurality of p-type light-emitting diodes (LEDs) bonded to the substrate through a first subset of the bond pads; a plurality of n-type LEDs bonded to the substrate through a second subset of the bond pads, wherein some of the bond pads belong to both the first subset and the second subset of the bond pads, and wherein the p-type LEDs and the n-type LEDs are arranged as alternating pairs; a plurality of transparent and conductive components each disposed over and electrically interconnecting one of the pairs of the p-type and n-type LEDs; and one or more lenses disposed over the n-type LEDs and the p-type LEDs.

In some embodiments, the p-type and n-type LEDs of the photonic lighting apparatus are electrically interconnected without bond wires.

In some embodiments, the plurality of p-type and n-type LEDs are electrically interconnected together using the bond pads and the transparent and conductive components.

In some embodiments, the p-type and n-type LEDs each include vertical LEDs.

In some embodiments, the submount includes a plurality of through-substrate-vias (TSVs) that are electrically coupled to some of the bond pads; the submount includes further bond pads that are located on a second side of the substrate opposite from a first side to which the LEDs are bonded; and the further bond pads are electrically coupled to the TSVs.

Yet another aspect of the present disclosure involves a method of packaging light-emitting diodes (LEDs). The method includes: fabricating a plurality of p-type vertical LEDs; fabricating a plurality of n-type vertical LEDs; bonding the p-type vertical LEDs and the n-type vertical LEDs to a submount; and forming a plurality of transparent cladding layer (TCL) components over the p-type and n-type vertical LEDs, each TCL component electrically interconnecting one of the p-type vertical LEDs with one of the n-type vertical LEDs.

In some embodiments, the fabricating the plurality of p-type vertical LEDs includes: growing a plurality of epi-layers over a growth substrate, the epi-layers including an n-type semiconductor layer, a p-type semiconductor layer, and a multiple-quantum-well (MQW) layer disposed between the n-type and p-type semiconductor layers; forming an Ohmic contact layer over the epi-layers; forming a plurality of openings in the Ohmic contact layer and the epi-layers, thereby forming a plurality of mesa structures that are separated from one another by the openings; forming a reflector layer over the Ohmic contact layer in each of the mesa structures; forming a barrier layer over the reflector layer in each of the mesa structures; forming a bonding pad over the barrier layer in each of the mesa structures; and performing a sigulation process to extend the openings through the growth substrate, thereby forming a plurality of separated p-type vertical LEDs. In some embodiments, the method further includes: after the bonding, removing the growth substrate from each of the p-type vertical LEDs.

In some embodiments, the fabricating the plurality of n-type vertical LEDs includes: growing a plurality of epi-layers over a growth substrate, the epi-layers including an n-type semiconductor layer, a p-type semiconductor layer, and a multiple-quantum-well (MQW) layer disposed between the n-type and p-type semiconductor layers; bonding a carrier substrate to the growth substrate and the epi-layers disposed thereon; thereafter removing the growth substrate; forming a plurality of openings in the epi-layers, thereby forming a plurality of mesa structures that are separated from one another by the openings; forming an Ohmic contact layer over the n-type semiconductor layer in each of the mesa structures; forming a reflector layer over the Ohmic contact layer in each of the mesa structures; forming a barrier layer over the reflector layer in each of the mesa structures; forming a bonding pad over the barrier layer in each of the mesa structures; and performing a sigulation process to extend the openings through the carrier substrate, thereby forming a plurality of separated n-type vertical LEDs.

In some embodiments, the submount includes a plurality of bonding pads, and wherein the p-type and n-type vertical LEDs are bonded to the submount through the bonding pads. In some embodiments, at least a subset of the bonding pads are each configured to electrically interconnect one of the p-type vertical LEDs with a neighboring one of the n-type vertical LEDs.

In some embodiments, the method further includes: forming a phosphor material over the p-type and the n-type vertical LEDs; forming a protection layer over the phosphor material; and forming one or more lenses over the protection layer. In some embodiments, the surface of the protection may be roughened to create a textured surface.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A light-emitting diode (LED) packaging structure, comprising:
   a submount, said submount including a substrate;
   a plurality of conductive pads located on the substrate;
   a plurality of LEDs bonded to the submount substrate through the plurality of conductive pads, wherein the plurality of LEDs includes p-type vertical LEDs and n-type vertical LEDs that are arranged in an alternating manner in a p-n-p-n-p-n configuration; and
   a transparent material disposed between the plurality of LEDs and over a portion of a top surface of each of the plurality of LEDs, wherein a plurality of openings are defined by portions of the transparent material disposed over the portion of the top surface of each of the plurality of LEDs;
   wherein:
   the p-type and n-type vertical LEDs each include a respective p-type doped semiconductor layer and an n-type doped semiconductor layer;
   for the p-type vertical LED, the p-type doped semiconductor layer is located closer to the submount substrate than the n-type doped semiconductor layer; and
   for the n-type vertical LED, the n-type doped semiconductor layer is located closer to the submount substrate than the p-type doped semiconductor layer.

2. The LED packaging structure of claim 1, further comprising: a plurality of transparent cladding layer (TCL) components disposed over the plurality of LEDs and partially within the openings, respectively, wherein each TCL component is configured to electrically couple together one of the p-type vertical LEDs with an adjacent one of the n-type vertical LEDs.

3. The LED packaging structure of claim 1, wherein the LED packaging structure is free of bond wires.

4. The LED packaging structure of claim 1, wherein a subset of the bond pads are each configured to electrically couple together a p-type vertical LED and an adjacent n-type vertical LED.

5. The LED packaging structure of claim 1, further comprising:
   a phosphor film disposed over the plurality of LEDs; and
   a protective layer disposed over the phosphor film, the protective layer having a roughened surface.

6. The LED packaging structure of claim 1, further comprising: one or more lenses disposed over the plurality of LEDs, wherein the one or more lenses and the submount substrate are disposed on opposite sides of the LEDs.

7. The LED packaging structure of claim 1, wherein:
   the plurality of conductive pads include a first subset of conductive pads located on a first surface of the submount substrate and a second subset of conductive pads located on a second surface of the submount substrate opposite the first surface; and
   the substrate contains a plurality of through-substrate-vias that electrically interconnect the second subset of the conductive pads with some of the first subset of the conductive pads.

8. A photonic lighting apparatus, comprising:
   a submount including a substrate and a plurality of bond pads disposed on a first side of the substrate;
   a plurality of p-type light-emitting diodes (LEDs) bonded to the substrate through a first subset of the bond pads;
   a plurality of n-type LEDs bonded to the substrate through a second subset of the bond pads, wherein some of the bond pads belong to both the first subset and the second subset of the bond pads, and wherein the p-type LEDs and the n-type LEDs are arranged as alternating pairs according to a p-n-p-n-p-n configuration;
   a transparent material disposed between the plurality of LEDs and over a portion of a top surface of each of the plurality of LEDs, wherein a plurality of openings are defined by portions of the transparent material disposed over the portion of the top surface of each of the plurality of LEDs;
   a plurality of transparent conductive components each disposed over and electrically interconnecting one of the pairs of the p-type and n-type LEDs, wherein the transparent conductive components each include a respective portion that is disposed within a respective one of the openings; and
   one or more lenses disposed over the n-type LEDs and the p-type LEDs, wherein said n-type LEDs and said p-type LEDs are vertical LEDs.

9. The photonic lighting apparatus of claim 8, wherein the p-type and n-type LEDs of the photonic lighting apparatus are electrically interconnected without bond wires.

10. The photonic lighting apparatus of claim 8, wherein the plurality of p-type and n-type LEDs are electrically interconnected together using the bond pads and the transparent and conductive components.

11. The photonic lighting apparatus of claim 8, wherein:
    the submount includes a plurality of through-substrate-vias (TSVs) that are electrically coupled to some of the bond pads;

the submount includes further bond pads that are located on a second side of the substrate opposite from the first side to which the LEDs are bonded; and the further bond pads are electrically coupled to the TSVs.

12. A packaging structure, comprising:

a submount;

a plurality of metal pads located on the submount;

a plurality of photonic devices bonded to the submount through the plurality of metal pads; and a transparent material disposed between the plurality of photonic devices and over a portion of a top surface of each of the plurality of photonic devices, wherein a plurality of openings are defined by portions of the transparent material disposed over the portion of the top surface of each of the plurality of photonic devices;

wherein:

the photonic devices include a first subset of photonic devices and a second subset of photonic devices;

the first subset of photonic devices each include a light-emitting layer, a p-type layer disposed above the light-emitting layer, and an n-type layer disposed below the light-emitting layer;

the second subset of photonic devices each include a light-emitting layer, an n-type layer disposed above the light-emitting layer, and a p-type layer disposed below the light-emitting layer; and the first subset of photonic devices and the second subset of photonic devices interleave with one another in a p-n-p-n-p-n configuration, and wherein each of the first subset of photonic devices and the second subset of photonic devices include a vertical light-emitting diode (LED).

13. The packaging structure of claim 12, wherein the packaging structure is free of bond wires.

14. The packaging structure of claim 12, wherein the submount comprises a substrate and additional bond pads disposed on the substrate, and said metal bond pads are disposed on said additional bond pads, and wherein some of the additional bond pads have a respective photonic device from the first subset.

15. The packaging structure of claim 12, wherein the first and second subsets of photonic devices interleave in a manner such that:

the n-type layer of a first one of the photonic devices is electrically coupled to the p-type layer of a second one of the photonic devices;

the p-type layer of the first one of the photonic devices is electrically coupled to the n-type layer of a third one of the photonic devices; and the first one of the photonic devices is disposed between the second one and the third one of the photonic devices.

16. The packaging structure of claim 12, further comprising: one or more lenses disposed over the plurality of photonic devices, wherein the one or more lenses and the submount are disposed on opposite sides of the photonic devices.

17. The packaging structure of claim 12, wherein the submount includes one or more through-vias that are each electrically coupled to a respective one of the metal pads.

18. The packaging structure of claim 12, further comprising: a plurality of transparent cladding layer (TCL) components disposed over the plurality of photonic devices and partially within the openings, respectively, wherein each TCL component is configured to electrical couple together the p-type layer of one of the photonic devices to the n-type layer of another one of the photonic devices.

* * * * *